United States Patent
Chiu et al.

(10) Patent No.: US 12,087,605 B2
(45) Date of Patent: Sep. 10, 2024

(54) RETICLE POD WITH ANTISTATIC CAPABILITY

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Yi-Hsuan Lee, New Taipei (TW); Hsing-Min Wen, New Taipei (TW); Hsin-Min Hsueh, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 257 days.

(21) Appl. No.: 17/237,323

(22) Filed: Apr. 22, 2021

(65) Prior Publication Data
US 2022/0102177 A1 Mar. 31, 2022

Related U.S. Application Data

(60) Provisional application No. 63/085,221, filed on Sep. 30, 2020.

(51) Int. Cl.
| | |
|---|---|
| *H01L 21/673* | (2006.01) |
| *G03F 7/00* | (2006.01) |
| *G08C 17/02* | (2006.01) |
| *H05K 5/00* | (2006.01) |
| *H05K 5/02* | (2006.01) |

(52) U.S. Cl.
CPC .... *H01L 21/67359* (2013.01); *G03F 7/70741* (2013.01); *G08C 17/02* (2013.01); *H01L 21/67369* (2013.01); *H01L 21/67383* (2013.01); *H01L 21/67396* (2013.01); *H05K 5/0034* (2013.01); *H05K 5/0208* (2013.01)

(58) Field of Classification Search
CPC ........ H01L 21/67359; H01L 21/67396; G03F 1/66
USPC ......................................................... 206/701
See application file for complete search history.

(56) References Cited

U.S. PATENT DOCUMENTS

| | | | | |
|---|---|---|---|---|
| 5,999,397 | A * | 12/1999 | Chen | G03F 7/70741 361/270 |
| 6,239,863 | B1 * | 5/2001 | Catey | H01L 21/67359 355/75 |
| 6,364,595 | B1 * | 4/2002 | Bonora | H01L 21/68707 414/416.1 |
| 2015/0131071 | A1 * | 5/2015 | Kim | G03F 1/62 355/72 |
| 2017/0294326 | A1 * | 10/2017 | Raschke | H01L 21/67011 |
| 2019/0107775 | A1 * | 4/2019 | Yanase | G03F 1/64 |
| 2020/0117079 | A1 * | 4/2020 | Wang | G03F 1/66 |

* cited by examiner

*Primary Examiner* — J. Gregory Pickett
*Assistant Examiner* — Jenine Pagan
(74) *Attorney, Agent, or Firm* — Locke Lord LLP; Tim Tingkang Xia, Esq.

(57) ABSTRACT

A reticle pod with antistatic capability includes a base and plural of support members. The base has a carrying surface having a recess formed thereon and defined by a bottom surface. The support members encircle the carrying surface of the base and are adapted to support a reticle. The recess is defined by a depth extending between the carrying surface and the bottom surface. The depth ranges from 300 μm to 3400 μm to thereby weaken the electrostatic force exerted upon particles on the carrying surface.

8 Claims, 9 Drawing Sheets

RETICLE POD WITH ANTISTATIC CAPABILITY

BACKGROUND OF THE INVENTION

Field of the Invention

The present disclosure relates to reticle pods and, more particularly, to a reticle pod with antistatic capability.

Description of the Prior Art

Figure 1:
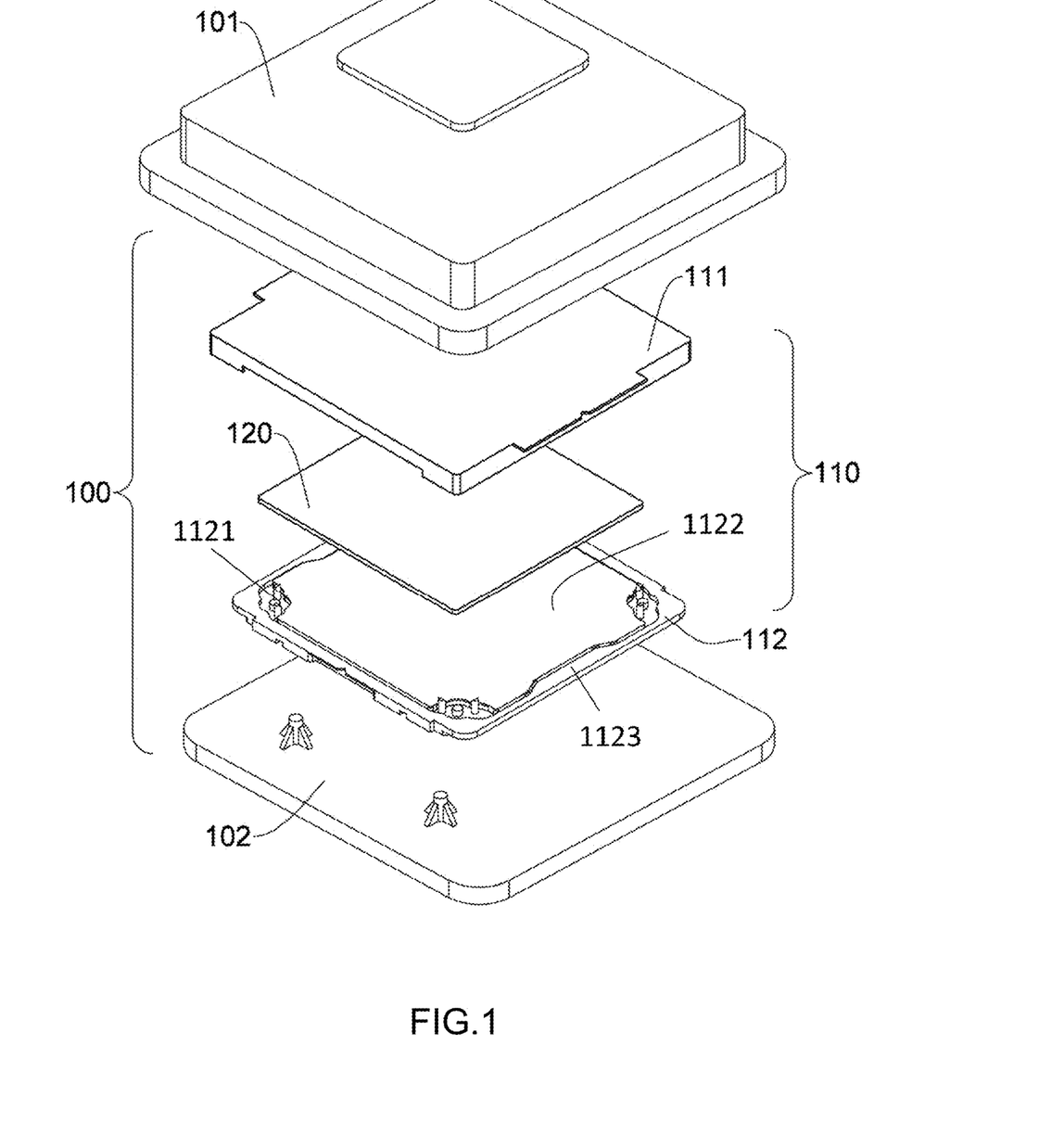
FIG. 1 (PRIOR ART) is an exploded view of a conventional reticle pod.

Reticles for use in a conventional EUV process must be protected with dedicated EUV reticle pods. FIG. 1 shows a reticle pod which receives the EUV reticle, includes an outer pod (100) and an inner pod (110), and has an inner layer and outer layer receiving spaces defined by the outer pod (100) and the inner pod (110). The outer pod (100) comprises a lid (101) and a base (102) which are coupled together to define a receiving space for receiving the inner pod (110). The inner pod (110) comprises a lid (111) and a base (112) which are coupled together by a special means to define a receiving space for receiving a reticle (120) and providing a hermetic seal thereto.

When reticle (120) is received in inner pod (110), the edges or bottom of reticle (120) is supported by support members (1121) on base (112), such that the downward-facing surface of reticle (112) is slightly higher than an upward-facing carrying surface (1122) of reticle (120). The upward-facing carrying surface (1122), which is hereinafter referred to as carrying surface (1122), is encircled by support members (1121) and is of an area greater than the area of a pattern zone (not shown) of reticle (120). The carrying surface (1122) is different from upward-facing contact surface (1123) disposed at the periphery of base (112) and adapted to be in contact with lid (111). The upward-facing contact surface (1123) is ring-shaped.

The reticle (120) taken out of exposure equipment has residual voltage, and the residual voltage is greater than 50 V. If the reticle (120) with the residual voltage is put back into inner pod (110), particles on base (112) may be adsorbed to the bottom of reticle (120). If the particles are adsorbed to the pattern zone of reticle (120), the reticle (120) will end up with a pattern defect in the next instance of the exposure process.

Figure 2:
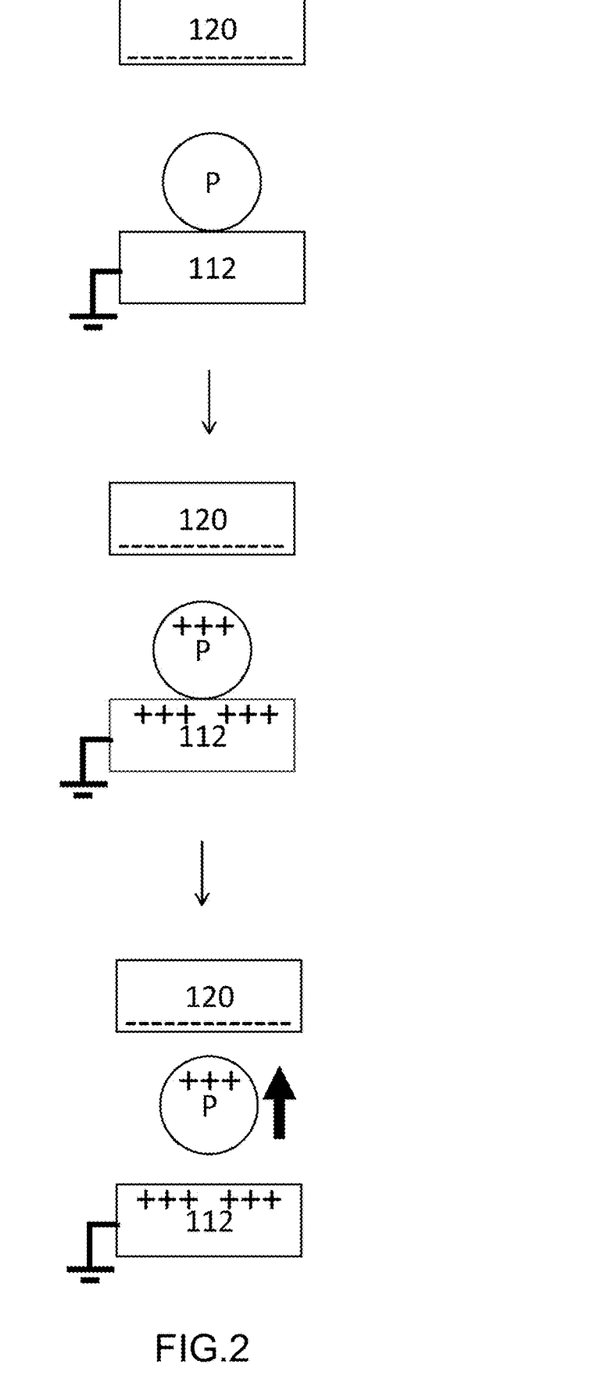
FIG. 2 (PRIOR ART) shows the steps of the approach of a charged reticle to a base of the reticle pod.

FIG. 2 shows the steps of the approach of the charged reticle (120) to base (112). The base (112) is grounded and thus is not charged; however, a particle (P) is present on an upper surface (for example, the aforesaid carrying surface (1122) of base (112)). When the charged reticle (120) approaches base (112) to a certain extent, the electric field generated by the negative charges of reticle (120) causes the upper surface of base (112) and particle (P) to generate positive charges. When reticle (120) approaches base (112) to a greater extent, the strength of the electrostatic field is sufficient to attract particle (P), such that particle (P) escapes from the upper surface of base (112) and thus gets adsorbed to the bottom of reticle (120). Obviously, all defects caused by electrostatic charges cannot be overcome by grounding base (112).

Considering the reticle defects caused by the electrostatic charges, it is necessary to provide a reticle pod with antistatic capability so as to receive the reticle carrying electrostatic charges.

SUMMARY OF THE INVENTION

Figure 3:
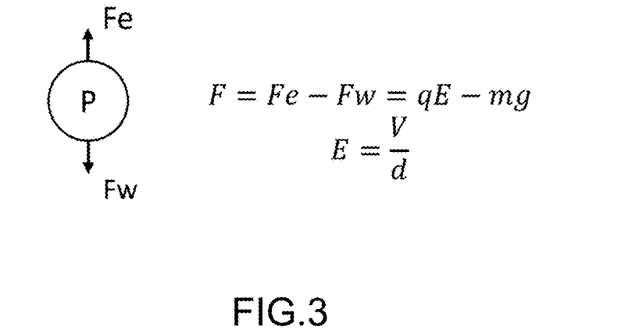
FIG. 3 (PRIOR ART) shows a particle subjected to electrostatic force and gravity.

FIG. 3 shows that particle (P) is subjected to gravity (Fw) and electrostatic force (Fe), where F denotes resultant force, q denotes amount of charges, E denotes electrostatic field, m denotes mass of particle, g denotes gravity constant, V denotes voltage, and d denotes gap between bottom of reticle and upper surface of base. Thus, factors in causing particle (P) on the base to adsorb to the reticle bottom include particle size (weight), reticle charge amount, and distance between bottom of reticle and upper surface of base.

Therefore, it is an object of the present disclosure to provide a reticle pod with antistatic capability, comprising: a base having a carrying surface, the carrying surface having a recess defined by a bottom surface; and a plurality of support members encircling the carrying surface of the base and configured to support a reticle, such that the recess is defined by a depth extending between the carrying surface and the bottom surface, the depth ranging from 300 μm to 3400 μm, so as to weaken electrostatic force exerted upon particles on the carrying surface.

In a specific embodiment, the base further has an upward-facing contact surface encircling the carrying surface and adapted to be in contact with a lid to form a receiving space hermetically sealed.

In a specific embodiment, the recess has a ring-shaped edge encircling a zone of an area equal to or greater than an area of a pattern zone of the reticle.

In a specific embodiment, the recess has a ring-shaped edge encircling a zone of an area is sufficient to cover a pattern zone of the reticle.

In a specific embodiment, the recess has a rectangular edge with a length of 138 mm and a width of 110 mm.

In a specific embodiment, a residual voltage of the reticle is greater than 50 V, and the depth is at least greater than 400 μm.

Another objective of the present disclosure is to provide a reticle pod with antistatic capability, comprising: a base having an upper surface, the upper surface being a deflected surface formed by mechanical processing; and a plurality of support members encircling the upper surface and configured to support a reticle, wherein formed between a downward-facing surface of the reticle and the upper surface of the base is a gap at least greater than 300 μm to weaken electrostatic force exerted upon particles on the upper surface of the base.

In a specific embodiment, the base further has an upward-facing contact surface encircling the upper surface and adapted to be in contact with a lid to form a receiving space hermetically sealed.

In a specific embodiment, an area of the upper surface is equal to or greater than an area of a pattern zone of the reticle.

In a specific embodiment, a zone of the upper surface is sufficient to cover a pattern zone of the reticle.

In a specific embodiment, the upper surface has a rectangular edge with a length of 138 mm and a width of 110 mm.

In a specific embodiment, a residual voltage of the reticle is greater than 50 V, and the gap is at least greater than 400 μm.

Yet another objective of the present disclosure is to provide a method of processing a reticle pod, applied to a base of a reticle pod, the base having a carrying surface and a plurality of support members, the plurality of support members encircling the carrying surface of the base and configured to support a reticle. The method comprises the steps of: processing mechanically the carrying surface to form thereon a recess, the recess being defined by a bottom surface; and processing the recess to define the recess by a depth according to a residual voltage of the reticle, the depth being at least greater than 300 µm.

In a specific embodiment, when the residual voltage is greater than 50 V, the depth is at least greater than 400 µm.

In a specific embodiment, when the residual voltage is greater than 100 V, the depth is at least greater than 400 µm.

In a specific embodiment, when the residual voltage is greater than 200 V, the depth is at least greater than 800 µm.

In a specific embodiment, when the residual voltage is greater than 400 V, the depth is at least greater than 1600 µm.

BRIEF DESCRIPTION OF THE DRAWINGS

The present disclosure is depicted with the accompanying drawings and described below. Non-restrictive, non-exhaustive embodiments are hereunder presented with reference to the accompanying drawings. The accompanying drawings are intended to illustrate technical features and principles but are not necessarily drawn to scale.

DETAILED DESCRIPTION OF THE EMBODIMENTS

The present disclosure is hereunder described with reference to the accompanying drawings and illustrated by specific embodiments. However, the subject matter claimed by the present disclosure can be implemented in different forms, and thus its scope is not restricted to exemplary examples and embodiments disclosed below. The exemplary examples and embodiments serve illustrative purposes only. The present disclosure provides reasonably broad scope to the subject matter claimed.

The expression "in an embodiment" used herein does not necessarily refers to the same specific embodiment. The expression "in another embodiment" used herein does not necessarily refers to different specific embodiments. The subject matter claimed shall be deemed falling within the scope of a combination of exemplary examples and embodiments, in whole or in part.

Figure 4:
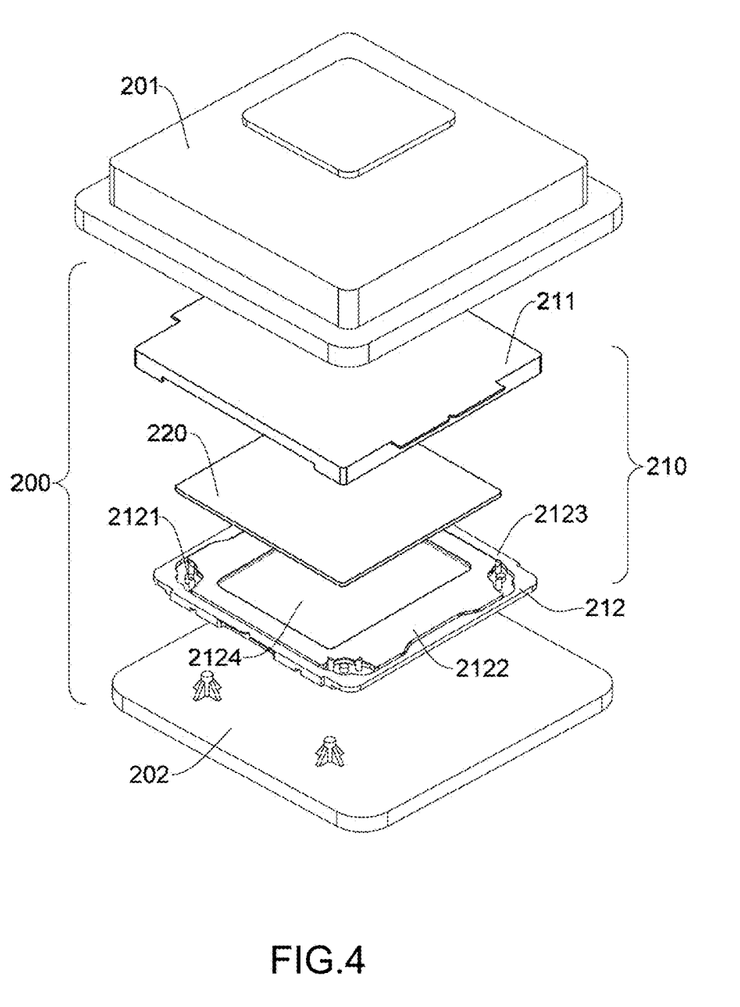
FIG. 4 is an exploded view of a reticle pod of the present disclosure.

FIG. 4 is an exploded view of a reticle pod of the present disclosure. Similar to FIG. 1, FIG. 4 shows an outer pod (200) and an inner pod (210). The outer pod (200) comprises a lid (201) and a base (202). The lid (201) and the base (202) together define a receiving space for receiving the inner pod (210). The inner pod (210) further comprises a lid (211) and a base (212) which together define a receiving space for receiving a reticle (220). The inventive technical features of present disclosure lie in base (212). The other details of outer pod (200) and lid (211) of inner pod (210) are omitted from the description below.

The base (212) has a plurality of support members (2121), an upward-facing carrying surface (hereinafter referred to as carrying surface (2122)) and an upward-facing contact surface (2123). The support members (2121) are disposed between carrying surface (2122) and upward-facing contact surface (2123) and encircle carrying surface (2122). The support members (2121) are configured to assume different shapes in order to support the bottom or lateral edges of reticle (220). For instance, in this embodiment, each support member (2121) has two limiting posts for limiting the transverse displacement of reticle (220) and a support pin for coming into contact with the downward-facing surface of the reticle and thus lifting reticle (220) to above carrying surface (2122). The gap between the downward-facing surface of reticle (220) and carrying surface (2122) depends on the height of the support pin. Basically, carrying surface (2122) is flat; however, in practice, at least a part of carrying surface (2122) is a deflected surface formed by mechanical processing and seldom discernible by the naked eye. The carrying surface (2122) is mechanically processed to form thereon a recess (2124). The recess (2124) is not only substantially centrally disposed at carrying surface (2122) but also encircled by carrying surface (2122). When reticle (220) lies on support members (2121), the pattern zone of reticle (220) corresponds in position to recess (2124).

Figure 5:
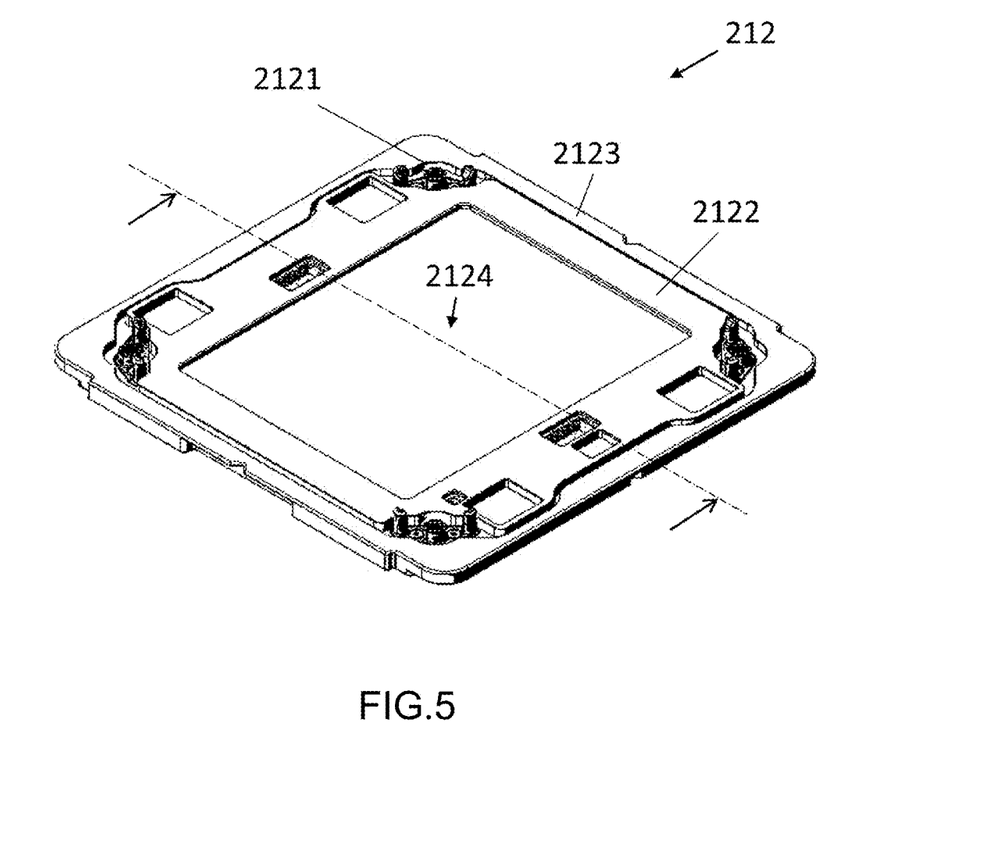
FIG. 5 is a perspective view of a base of the reticle pod.
Figure 6:
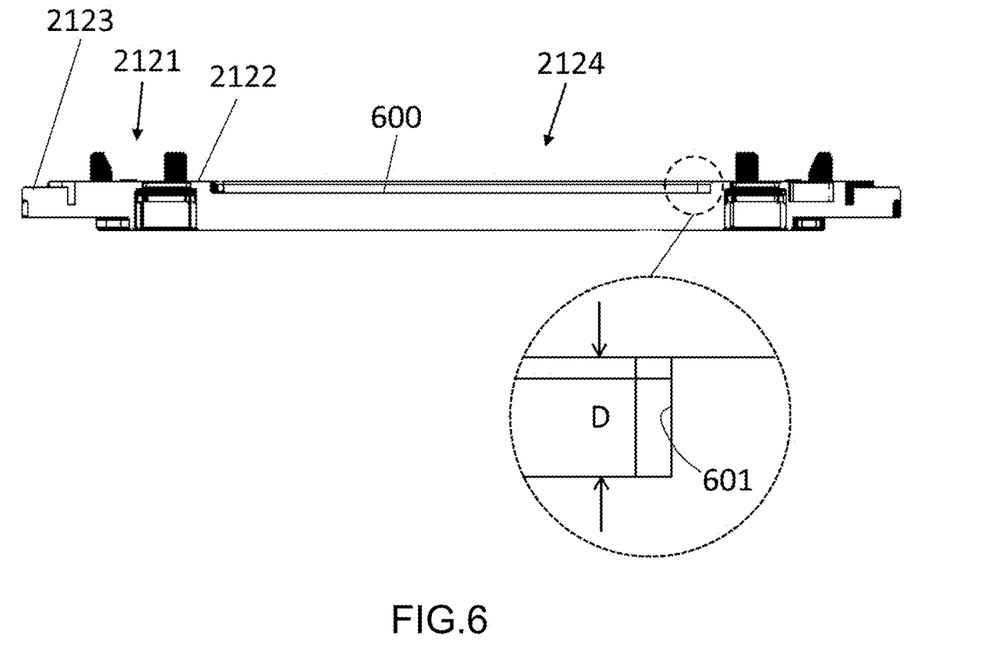
FIG. 6 is a cross-sectional view based on FIG. 5.

FIG. 5 shows fine structural features of base (212). FIG. 6 is a cross-sectional view taken along the dashed line of FIG. 5. As shown in the diagrams, a groove (not indicated by any reference numeral) is formed between carrying surface (2122) and upward-facing contact surface (2123) at the periphery of base (212) and adapted to capture particles which squeeze through the junction of lid (211) and base (212). FIG. 6 clearly shows that carrying surface (2122) is higher than upward-facing contact surface (2123) to create structural barrier and thus lower the chance that the particles will fall on carrying surface (2122), thereby ensuring the cleanliness of inner pod (210). In a variant embodiment, carrying surface (2122) and upward-facing contact surface (2123) are of the same height, or carrying surface (2122) is lower, and the groove may also be filled fully. The recess (2124) is defined by a bottom surface (600) and a wall surface (601) and thus defined by a depth (D). The depth (D) is a processing depth, that is, the vertical distance between carrying surface (2122) and recess bottom surface (600), as shown in FIG. 6. Since recess (2124) is also formed by mechanical processing, bottom surface (600) may also be deflected.

Figure 7:
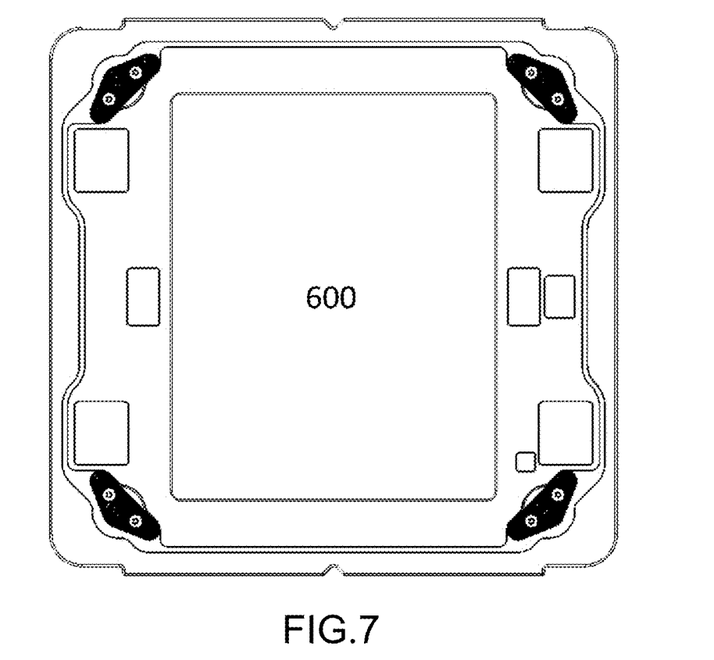
FIG. 7 is a top view of the base of the reticle pod of FIG. 5.
Figure 8:
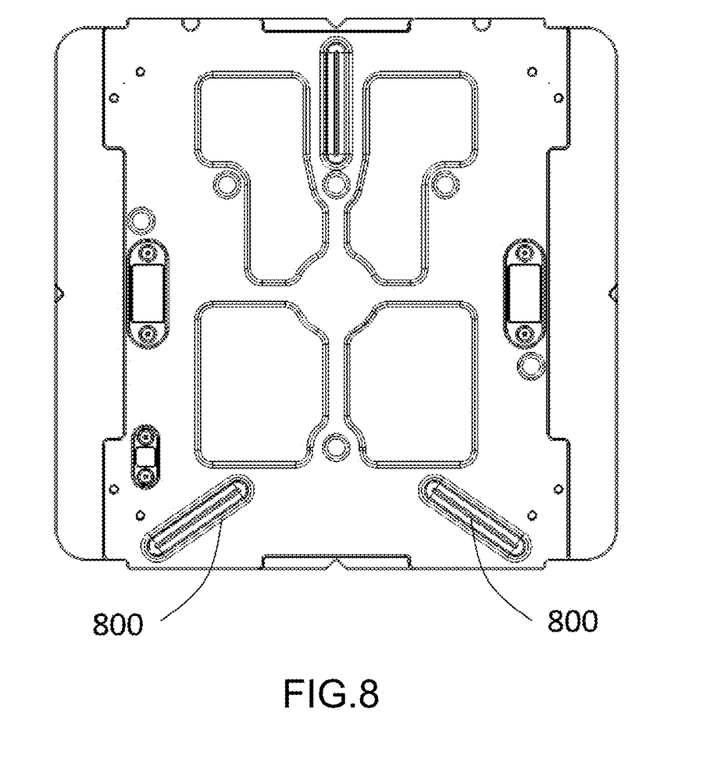
FIG. 8 is a bottom view of the base of the reticle pod of FIG. 5.

FIG. 7 is a top view of base (212) of FIG. 5. As shown in the diagram, the opening (defined by inner edges of the carrying surface) of recess (2124) and bottom surface (600) are rectangles, and both the opening and bottom surface (600) have substantially the same area. In an embodiment, the rectangles are each of a length of 138 mm and a width of 110 mm. The recess (2124) is substantially centrally disposed at carrying surface (2122) and is not in contact with any sides thereof. FIG. 8 is a bottom view of base (212) of FIG. 5, showing that positioning structures (800) disposed on the bottom of base (212) and adapted to position base (212) in a process machine.

Figure 9A:
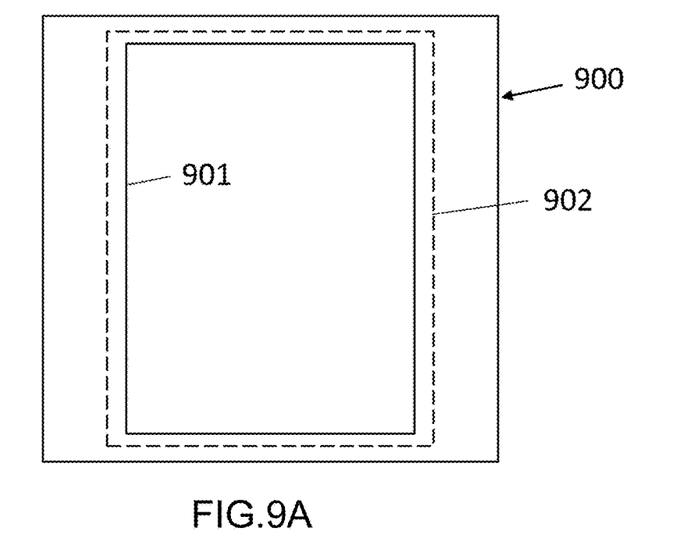
FIG. 9A shows the relationship between a reticle pattern zone and a recess coverage zone.
Figure 9B:
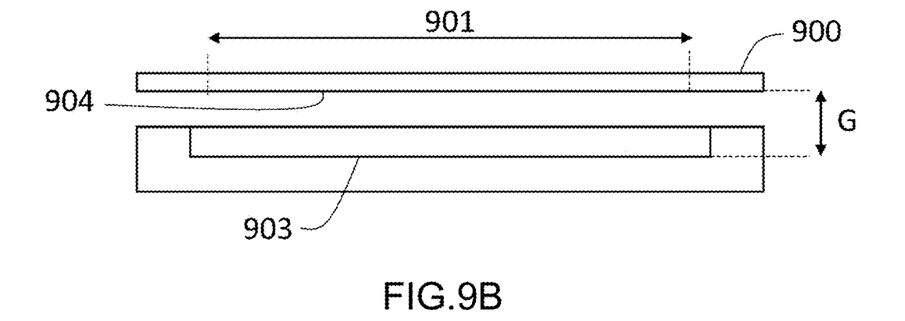
FIG. 9B shows a gap between a reticle and a recess bottom surface.

FIG. 9A is a top view which shows the relationship between a reticle pattern region (901, demarcated by an encircling solid line) of a reticle (900) and a base recess region (902). A dashed line in the diagram defines a ring-shaped edge of the recess opening, defining that recess coverage region (902) is at least greater than reticle pattern region (901). This configuration ensures that every part of the reticle pattern zone faces the bottom surface of the recess. FIG. 9B is a lateral view which shows a gap (G) disposed between the downward-facing surface of reticle pattern region (901) and bottom surface (903) of the recess. Depending on the height of the reticle being supported, the height of lower surface (904) of the reticle can approximate to the height of the carrying surface of the base, thereby rendering the gap between lower surface (904) of the reticle and bottom surface (600) of the recess equal to the depth (depth D shown in FIG. 6) of the recess. In an embodiment, the depth (D) of the recess ranges from 300 μm to 3400 μm or from 3400 μm to 3750 μm. Thus, gap (G) is at least greater than 300 μm. Therefore, when a reticle carrying electrostatic charges is placed on the base, controlling the recess depth (D) or gap (G) can effectively weaken the electrostatic force exerted upon the particles on the carrying surface of the base and thus lower the chance that the particles will be attracted to the downward-facing surface of the reticle.

Figure 10:
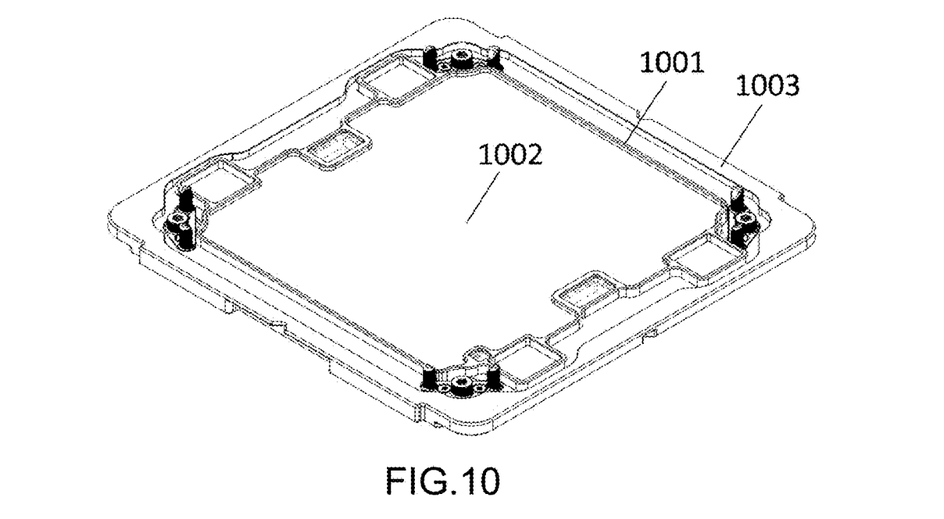
FIG. 10 is a perspective view of the base of the reticle pod according to another embodiment of the present disclosure.

FIG. 10 is a perspective view of the base of the reticle pod according to another embodiment of the present disclosure. Compared with FIG. 5, FIG. 10 shows a great decrease of the zone of the carrying surface in the base and an increase of the recess coverage zone, forming an upper surface (1002) encircled by a continuous wall (1001), and shows that the wall (1001) is still higher than the upward-facing contact surface (1003) to lower the chance of intrusion of contaminant particles into the upper surface (1002). In a variant embodiment, the wall (1001) is not required, and a groove shown in the diagram separates the upward-facing contact surface from the upper surface. Likewise, the electrostatic force exerted upon the particles on the upper surface of the base will be effectively weakened upon formation of a gap between a downward-facing surface of a reticle on the base and the upper surface (1002) and appropriate control of the depth of the upper surface (1002) to, for example, allow the vertical height of the wall (1001) to range from 300 μm to 3400 μm or allow the gap between the lower surface of the reticle and the upper surface (1002) to be at least greater than 300 μm.

Figure 11A:
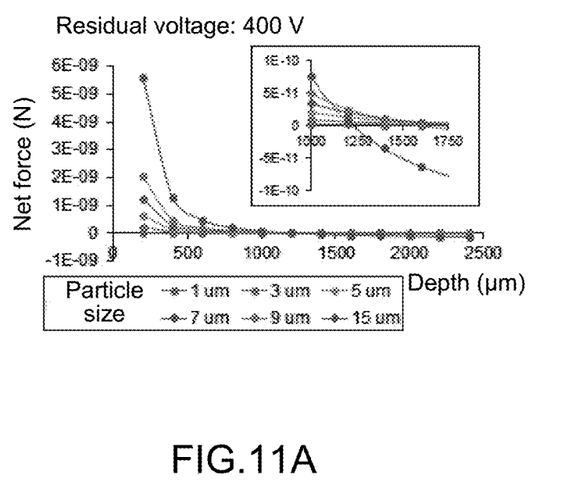
FIG. 11A through FIG. 11D shows the effect of different residual voltage of the reticle, different particle sizes and different gaps on the net force exerted upon particles.
Figure 11B:
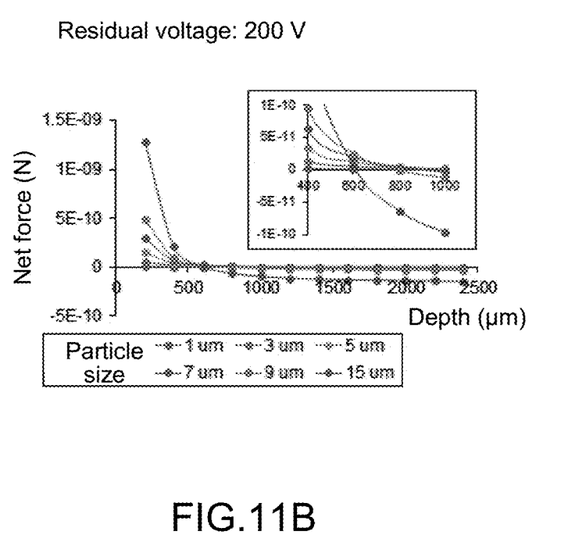
Figure 11C:
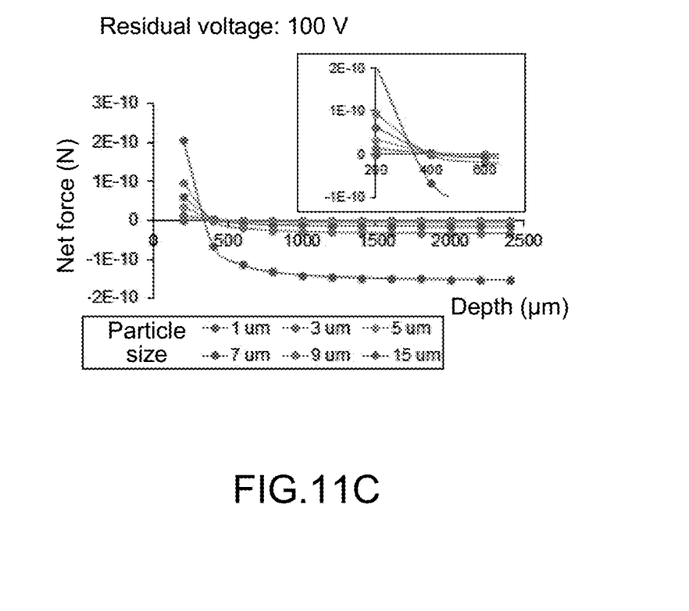
Figure 11D:
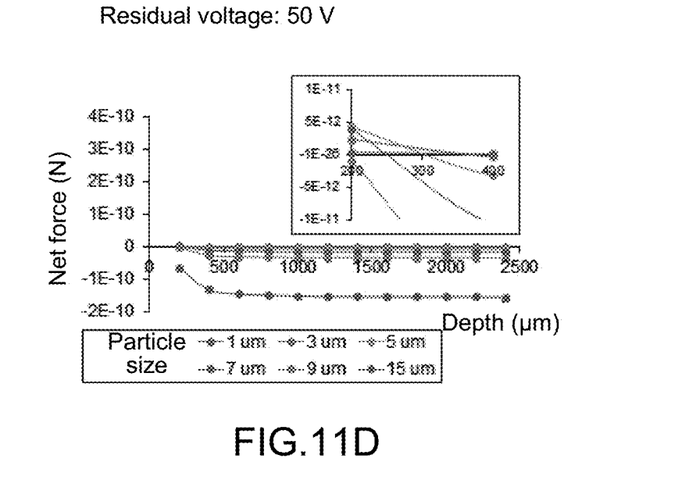

FIG. 11A through FIG. 11D show the effect of different residual voltage of the reticle, different particle sizes and different recess depths on the net force exerted upon particles. FIG. 11A shows graphs of net force exerted upon particles of six different sizes versus depth (D) according to the configurations illustrated in FIG. 6 and FIG. 9B, especially when the particles lie on bottom surface (903) of the recess and the residual voltage of the reticle is 400 V; as shown by the graphs, when the depth is greater than 1600 μm, the net force of all the particles turns negative, suggesting that the particles are subjected to a downward force, thereby effectively weakening the electrostatic force exerted upon the particles. Likewise, FIG. 11B shows graphs of net force exerted upon particles of the aforesaid sizes versus depth (D) when the residual voltage of the reticle is 200 V; as shown by the graphs, when the depth is greater than 800 μm, the electrostatic force exerted upon the particles is effectively weakened. FIG. 11C shows graphs of net force exerted upon particles of the aforesaid sizes versus depth (D) when the residual voltage of the reticle is 100 V; as shown by the graphs, when the depth is greater than 400 μm, the electrostatic force exerted upon the particles is effectively weakened. FIG. 11D shows graphs of net force exerted upon particles of the aforesaid sizes versus depth (D) when the residual voltage of the reticle is 50 V; as shown by the graphs, when the depth is greater than 400 μm, the electrostatic force exerted upon the particles is effectively weakened. In the aforesaid diagrams, although the graphs are not colored in such a manner to be distinguished from each other according to particle size, persons skilled in the art are still able to distinguish the graphs from each other in accordance with the disclosure contained in the diagrams and thereby understand the above description.

Therefore, the present disclosure provides a reticle pod. Controlling a processing depth of a recess in a base of the reticle pod or a gap between a bottom surface (upper surface) of the recess and a downward-facing surface of a reticle effectively weakens the effect of residual voltage of the reticle on particles on the surface of the base and thus lowers the chance the particles will be attracted to the downward-facing surface of the reticle, thereby protecting the pattern zone against contamination.

What is claimed is:

1. A reticle pod with antistatic capability, comprising:
   a base having a carrying surface, the carrying surface having a recess defined by a bottom surface; and
   a plurality of support members encircling the carrying surface of the base and configured to support a reticle, wherein the recess is defined by a depth extending between the carrying surface and the bottom surface, and the depth is at least greater than 400 μm when the reticle is supported by the plurality of support members in response to a residual voltage of the reticle is greater than 50 V, so as to weaken electrostatic force exerted upon particles on the carrying surface.

2. The reticle pod of claim 1, wherein the base further has an upward-facing contact surface encircling the carrying surface and adapted to be in contact with a lid to form a receiving space hermetically sealed.

3. The reticle pod of claim 1, wherein the recess has a ring-shaped edge encircling a zone of an area equal to or greater than an area of a pattern zone of the reticle when the reticle is supported by the plurality of support members.

4. The reticle pod of claim 1, wherein the recess has a ring-shaped edge encircling a zone sufficient to cover a pattern zone of the reticle when the reticle is supported by the plurality of support members.

5. A reticle pod with antistatic capability, comprising:
   a base having an upper surface, the upper surface being a deflected surface formed by mechanical processing; and
   a plurality of support members encircling the upper surface and configured to support a reticle, wherein formed between a downward-facing surface of the reticle and the upper surface of the base is a gap, and a depth of the gap is at least greater than 400 μm when the reticle is supported by the plurality of support members in response to a residual voltage of the reticle is greater than 50 V, so as to weaken electrostatic force exerted upon particles on the upper surface of the base.

6. The reticle pod of claim 5, wherein the base further has an upward-facing contact surface encircling the upper surface and adapted to be in contact with a lid to form a receiving space hermetically sealed.

7. The reticle pod of claim 5, wherein an area of the upper surface is equal to or greater than an area of a pattern zone of the reticle when the reticle is supported by the plurality of support members.

8. The reticle pod of claim 5, wherein a zone of the upper surface is sufficient to cover a pattern zone of the reticle when the reticle is supported by the plurality of support members.

\* \* \* \* \*